US010075142B2

(12) United States Patent
Hui

(10) Patent No.: US 10,075,142 B2
(45) Date of Patent: Sep. 11, 2018

(54) FACILITATION OF HEADPHONE AUDIO ENHANCEMENT

(71) Applicant: BITwave Pte Ltd, Singapore (SG)

(72) Inventor: Siew Kok Hui, Singapore (SG)

(73) Assignee: BITWAVE PTE LTD., Singapore (SG)

( * ) Notice: Subject to any disclaimer, the term of this patent is extended or adjusted under 35 U.S.C. 154(b) by 0 days.

(21) Appl. No.: 15/674,638

(22) Filed: Aug. 11, 2017

(65) Prior Publication Data

US 2017/0366152 A1    Dec. 21, 2017

Related U.S. Application Data

(62) Division of application No. 14/469,896, filed on Aug. 27, 2014, now Pat. No. 9,762,199.

(60) Provisional application No. 61/973,078, filed on Mar. 31, 2014.

(51) Int. Cl.
| | | |
|---|---|---|
| *H03G 3/20* | (2006.01) | |
| *H03G 7/00* | (2006.01) | |
| *G10L 21/14* | (2013.01) | |
| *H04R 3/04* | (2006.01) | |
| *H04R 1/10* | (2006.01) | |

(52) U.S. Cl.
CPC .............. *H03G 7/007* (2013.01); *G10L 21/14* (2013.01); *H03G 7/002* (2013.01); *H04R 1/1075* (2013.01); *H04R 3/04* (2013.01); *H04R 1/1041* (2013.01); *H04R 1/1083* (2013.01); *H04R 2430/01* (2013.01)

(58) Field of Classification Search
None
See application file for complete search history.

(56) References Cited

U.S. PATENT DOCUMENTS

| | | | |
|---|---|---|---|
| 4,473,906 A | * | 9/1984 | Warnaka ............ G10K 11/1784 367/1 |
| 4,638,506 A | | 1/1987 | Han |
| 5,125,032 A | | 6/1992 | Meister et al. |
| 5,761,314 A | | 6/1998 | Inanaga et al. |
| 6,792,120 B1 | | 9/2004 | Szenics |
| 6,829,359 B2 | | 12/2004 | Serrano |
| 8,385,563 B2 | | 2/2013 | Veau et al. |
| 2004/0247132 A1 | | 12/2004 | Klayman et al. |
| 2005/0105744 A1 | | 5/2005 | Lee |
| 2007/0274529 A1 | | 11/2007 | Nordin et al. |

(Continued)

FOREIGN PATENT DOCUMENTS

DE     2019343 A1    11/1970

OTHER PUBLICATIONS

European Search Report for European Patent Application No. 14197071.5-1910 dated Aug. 24, 2015, 6 pages.

(Continued)

*Primary Examiner* — Tan X Dinh
(74) *Attorney, Agent, or Firm* — Amin, Turocy & Watson, LLP

(57) ABSTRACT

A headphone with adjustable speaker drivers and a microphone can be used to determine and adjust sound pressure levels. The speaker drivers can be adjusted manually or wirelessly via a mobile device with a wireless connection to the headphone. Processing of audio and microphone data via the headphone can also be used to help determine and adjust the sound pressure levels.

20 Claims, 11 Drawing Sheets

(56) References Cited

U.S. PATENT DOCUMENTS

| | | | | |
|---|---|---|---|---|
| 2009/0147966 A1* | 6/2009 | McIntosh | ............... | H04R 3/005 |
| | | | | 381/71.11 |
| 2012/0114133 A1 | 5/2012 | Lee et al. | | |
| 2012/0155651 A1 | 6/2012 | Obata et al. | | |
| 2015/0195631 A1* | 7/2015 | Forrester | ................ | H04M 1/03 |
| | | | | 381/345 |
| 2015/0280677 A1* | 10/2015 | Hui | ....................... | H03G 7/007 |
| | | | | 381/57 |

OTHER PUBLICATIONS

European Office Action for EP Application Serial No. 14197071.5, dated Dec. 16, 2016, 4 pages.

Office Action dated Aug. 17, 2016 for U.S. Appl. No. 14/469,896, 15 pages.

Office Action dated Mar. 18, 2016 for U.S. Appl. No. 14/469,896, 14 pages.

Office Action dated Dec. 1, 2016 for U.S. Appl. No. 14/469,896, 15 pages.

* cited by examiner

FACILITATION OF HEADPHONE AUDIO ENHANCEMENT

CROSS REFERENCE TO RELATED APPLICATIONS

This application is a divisional application of, and claims priority to each of, U.S. patent application Ser. No. 14/469,896 (now U.S. Pat. No. 9,762,199), filed Aug. 27, 2014, and entitled FACILITATION OF HEADPHONE AUDIO ENHANCEMENT, which claims priority to U.S. Provisional Application No. 61/973,078, filed Mar. 31, 2014, and entitled FACILITATION OF HEADPHONE AUDIO ENHANCEMENT, the entireties of which applications are hereby incorporated herein by reference.

TECHNICAL FIELD

This disclosure relates generally to facilitation of headphone audio enhancement via use of speaker and microphone systems. For example, this disclosure relates to protection of hearing, during use of headphones, by audio adjustment based on a set of hearing parameters.

BACKGROUND

Stereo headphones in the market generally have fixed speaker driver positions within the ear cup housing, so these speaker drivers are not moveable. Therefore, the distance between the speaker drivers and the user's ear canals are also fixed. The acoustic wave that radiates from the speaker drivers into the user's ear-canals interact with each other and can be constructive or deconstructive depending on other physical factors such as the space between the speaker drivers, the user's ear-canals, ear cup materials, etc.

Many headphones and headsets allow for wireless streaming of music and songs from mobile devices. Headphones with poor sound insulation force the user to turn up the volume during use in noisy environments. Thus, prolonged exposure to loud sounds from headphones or headsets can severely affect the sensitivity of the user's hearing. Furthermore, many users are unable to tell whether the sound level emitted from the speaker drivers is too loud for prolonged usage.

The above-described background relating to headphone systems is merely intended to provide a contextual overview, and is not intended to be exhaustive. Other contextual information may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
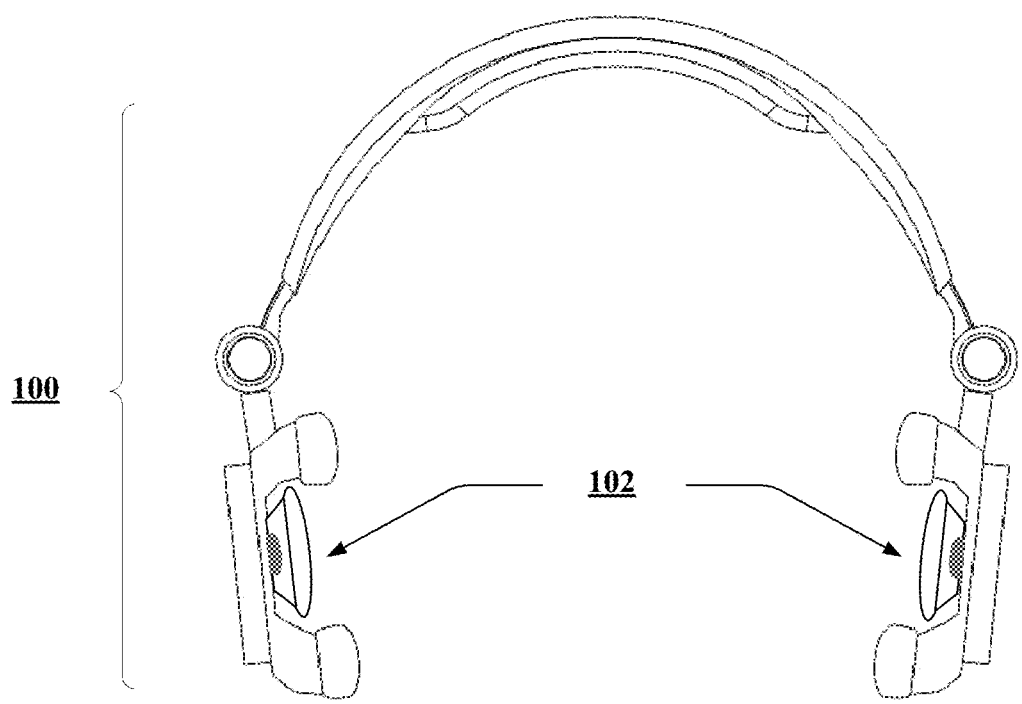
FIG. 1 illustrates an example headphone system with fixed speaker drivers.

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, these components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, a local area network, a wide area network, etc. with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As an overview of various embodiments presented herein, to correct for the above-identified deficiencies and other drawbacks of headphones and headsets, various embodiments are described herein to facilitate the use of configurable headphones and headsets. For example, headphones and headsets can be incorporated into other devices including, but are not limited to: glasses, headbands, helmets, etc.

For simplicity of explanation, the methods (or algorithms) are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts may be required to implement the methods. In addition, the methods could alternatively be represented as a series of interrelated states via a state diagram or events. Additionally, the methods described hereafter are capable of being stored on an article of manufacture (e.g., a computer readable storage medium) to facilitate transporting and transferring such methodologies to computers. The term article of manufacture, as used herein, is intended to encompass a computer program accessible from any computer-readable device, carrier, or media, including a non-transitory computer readable storage medium.

Utilizing a configurable headphone or headset in conjunction with a mobile device with a user interface for adjusting audio quality can aid a user in determining and adjusting audio quality for headphones or headsets. Described herein are systems, methods, articles of manufacture, and other embodiments or implementations that can facilitate usage of configurable headphones or headsets via a mobile device.

To significantly reduce severe hearing loss or prevent it from occurring at an early stage, a headphone or headset can be designed to measure the loudness of the internal and external sound of the headphone or headset via an embedded acoustic sensor. The measured sound data can keep the user informed of loud sounds to help prevent hearing loss or further deterioration of the user auditory system. A user interface can allow the user to mechanically or wirelessly position the headphone or headset speaker drivers to a location to optimize the listening pleasure of the user. The interface can allow the headphone or headset settings to be adjusted to the user's listening preferences.

The distance between each of the headphone's speaker drivers and the user's ear canal can be adjustable. Therefore, the distance between the headphones speaker driver to the user ear canal can be adjusted mechanically by turning a knob clockwise or counter-clockwise or wirelessly through an application on a mobile device. The distances between the speaker driver and the user's ear canal can be adjusted until the audio quality is optimal.

The headphone or headset can be embedded with a microphone located in such a way that it is able to estimate the sound pressure level (SPL) emitted from the speaker driver to the user ear canal. A transfer function can be derived to estimate the SPL into the ear canal with respect to the actual microphone location. The microphone can also be calibrated to improve efficiencies of the system. The SPL can be represented by the following equation:

$$SPL_{in-ear} = C * SPL_{mic} \quad (1)$$

$SPL_{in-ear}$ can be the actual sound pressure level into the user ear canal, $SPL_{mic}$ can be the sound pressure level measure at the actual microphone location and C can be the transfer function which is derived by the measurement.

Once the calibration curve is obtained or the transfer function is derived, the SPL emitted from each of the speaker drivers can be estimated continuously as the audio is playing. The continuous SPL estimation can allow for each song played to generate a maximum SPL, a dynamic profile, a minimum SPL, and the probability or the percentage of time that the SPL exceeds an acceptable critical hearing level. An acceptable critical hearing level can depend upon the user. However, for exemplary purposes, 90 dB is used herein to represent an acceptable hearing level. This information can be recorded and presented via a graphical rendering on a mobile device.

At the end of each song or audio file, if the detected SPL is deemed to have exceeded the critical hearing level and/or has also exceeded a specific duration, an audible warning or signal can be sent through the headphone or headset. The song or music can be compressed to an optimum level when the same song or music again plays via the headphones again. Captured data such as maximum SPL, minimum SPL and dynamic profile of each song can also be transferred to the smartphone using any wireless means including, but not limited to: Bluetooth, Wireless Fidelity (Wi-Fi), ZigBee, etc. The captured data can be used to optimize the next playback of the same song so that the low level sound is enhanced and the high level sound is compressed.

The interface for the mobile device can run on top of a standard audio and transport layer application program interface (API) provided by the mobile device to allow for versatile software configuration. The headphone can comprise two-speaker drivers—left and right, a headband, and a cable or wireless connectivity to a mobile device. The position of the speaker drivers with respect to an ear canal can be adjusted manually by rotating knobs in a clockwise or counter-clockwise motion to move the speaker drivers nearer or away from the the ear canal. Rotating the knobs can continuously change audio signal quality factors including, but not limited to: accuracy, enjoyability, bass, intelligibility, clearness, etc. The headphone's speaker driver location can also be adjusted wirelessly by manipulating the mobile device's graphical interface.

The headphone can be embedded with an SPL measurement capability. The SPL measuring capability can comprise a microphone positioned in front of the headphone speaker drivers to capture the sound emitted from the speaker drivers. An algorithm can be used to illustrate the estimation of the SPL of the emitted signal. The algorithm can comprise a maximum SPL, a minimum SPL, an average SPL, and can be used to calculate the percentage of time that the SPL exceeds 90 dB or the percentage of time the SPL is below 20 dB.

The SPL of the signal can be computed on a frame-by-frame basis using the algorithm outlined in the equations below:

$$y(n)=\alpha*x(n)-\alpha*x(n-1)+\beta*y(n-1) \quad (2)$$

Where y(n) can be the approximated B-weighted output signal of an infinite impulse response (IIR) filter; x(n) can be the input signal to the IIR filter and n can be the time index, whereas α and β can be the required filter coefficients. The output signal y(n) can be smoothed using a time constant corresponding to the frame length required, as illustrated by the equation below:

$$P(n)=\gamma*P(n-1)+(1-\gamma)*y(n)^2 \quad (3)$$

Where P(n) can be the output power of the smoothing filter for a frame and γ can be the required time constant of the smoothing filter and n is the time index. The output power of a frame can be computed in dB after every N samples.

$$P_{dB}(K)=10 \log_{10} P(K) \quad (4)$$

Where K can represent the frame index.

A non-linear weighing function or S-function as illustrated in equation (5) can be used to weigh signals accordingly.

$$S=f\{P_{dB}(K), \Upsilon, \beta\} \quad (5)$$

Where S can be a non-linear weighting function with inputs $P_{dB}(K)$, $\Upsilon$ and β, where $P_{dB}(K)$ can be the input variable and $\Upsilon$ can be the lower limit of the variable and β can be the upper limit of the variable. The overall loudness of the song or the music can be obtained by taking a weighted average of the individual level estimates as follows:

$$L=\Sigma_{k=0}^{M-1} W(k)*P_{dB}(k) \quad (6)$$

$$W(i)=S(i)/\Sigma_{m=0}^{M-1} S(j) \quad (7)$$

Whereas L can be the overall loudness of the song or music, S(k) can be the weighing function and $P_{dB}(k)$ can be the SPL estimate for the k frame. W(i) can be the normalized weight of the song or music for frame i. The song or music maximum, minimum, and average SPL can also be estimated including an overall estimation for a dynamic profile.

The various embodiments can also be implemented in connection with any type of mobile device with a connection to a communications network (e.g., a wireless communications network, the Internet, or the like), such as a mobile handset, a computer, a handheld device, or the like.

Acoustic wave construction or deconstruction can severely disturb audio quality. Currently, headphones do not allow adjustment of the position of the speaker driver with respect to an ear canal to improve hearing preferences. Therefore it is necessary to measure the loudness or the sound pressure level inside the headphones and present loudness and/or sound level data.

In one embodiment, a headphone speaker driver can be adjusted to optimize sound quality by generating audio and microphone data. The audio and microphone data can then be processed to calibrate audio via the headphone.

According to another embodiment, described herein is a method for determining sound pressure level data and adjusting speaker driver locations to optimize sound quality. The speaker drivers can be adjusted separately or simultaneously.

According to yet another embodiment, an article of manufacture, such as a computer readable storage medium or the like, can store instructions that, when executed by a computing device, can facilitate determining sound pressure level data and adjusting speaker driver locations to optimize sound quality.

Additionally, according to a further embodiment, described herein is a system that can facilitate sound quality optimization. The system can also facilitate a storing of sound pressure level data. The system can include a display component via wireless communication with a mobile device.

These and other embodiments or implementations are described in more detail below with reference to the drawings.

Referring now to FIG. 1, illustrated is an example headphone system 100 with fixed speaker drivers 102. The speaker drivers 102 can be fixed within an ear cup housing of the headphone system 100, which means that the distance between the speaker drivers 102 to an ear canal is also fixed. Acoustic waves that radiate from the speaker drivers 102 into the ear canal can interact with each other and can be constructive or destructive depending on factors including, but not limited to, distance between the speaker drivers 102, distance to the ear canal, materials of the ear cup housing, etc.

Figure 2A:
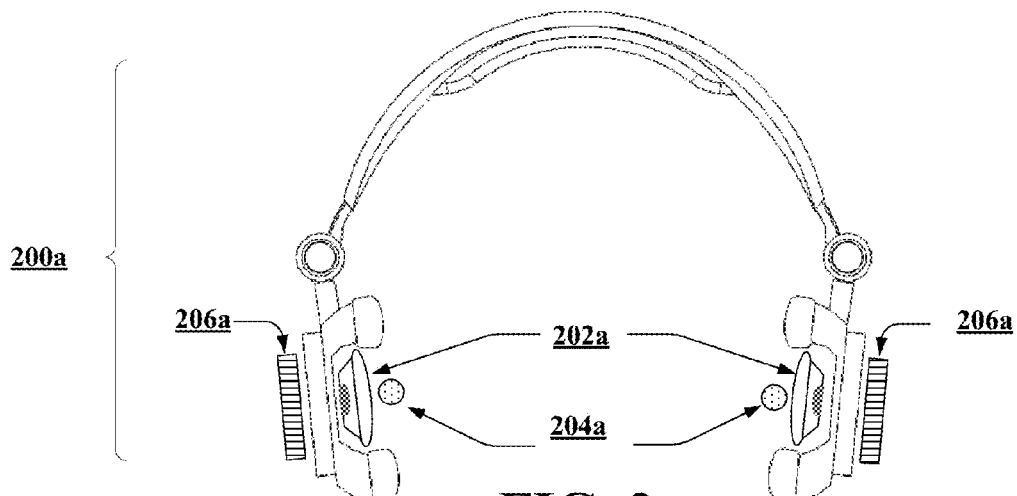
FIG. 2a illustrates an example headphone system comprising a microphone.

Referring now to FIG. 2a, illustrated is an example headphone system 200a comprising an acoustic sensor microphone(s) 204a. The headphone system 200a can have a rotatable knob(s) 206a that mechanically adjusts the position of the speaker driver(s) 202a. The microphone(s) 204a can be used measure the loudness of sound inside of the headphone system 200a. The location of the microphone(s) 204a can be positioned to allow it to estimate the sound pressure level emitted from the speaker driver(s) 202a.

Figure 2B:
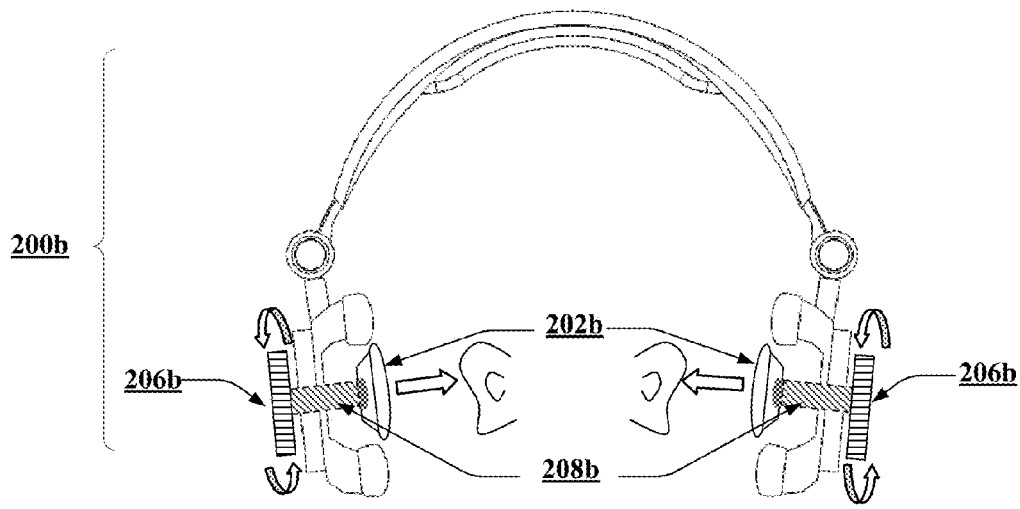
FIG. 2b illustrates an example headphone system with a rotatable knob for adjusting a speaker driver position towards an ear canal.

Referring now to FIG. 2b, illustrated is an example headphone system 200b with a rotatable knob(s) 206b for adjusting a speaker driver(s) 202b position towards an ear canal. The distance between the headphone system's 200b speaker driver(s) 202b and the ear canal can be adjusted mechanically by turning the rotatable knob(s) 206a clockwise or counter-clockwise so that a shaft(s) 208b moves toward the ear canal. A mobile device can also adjust the distance between the headphone system's 200b speaker driver(s) 202b and the ear canal wirelessly.

Figure 2C:
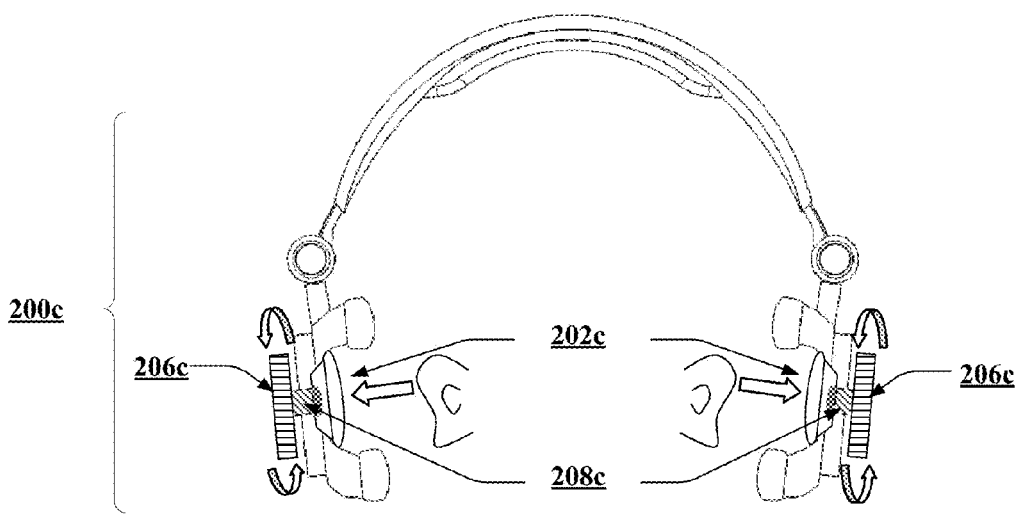
FIG. 2c illustrates an example headphone system with a rotatable knob for adjusting a speaker driver position away from an ear canal.

Referring now to FIG. 2c, illustrated is an example headphone system 200c with a rotatable knob(s) 206c for adjusting a speaker driver(s) 202c position away from an ear canal. The distance between the headphone system's 200c speaker driver(s) 202c and the ear canal can be adjusted mechanically by turning the rotatable knob(s) 206c clockwise or counter-clockwise so that a shaft(s) 208c moves away from the ear canal. A mobile device can also adjust the distance between the headphone system's 200c speaker driver(s) 202c and the ear canal wirelessly.

Figure 3:
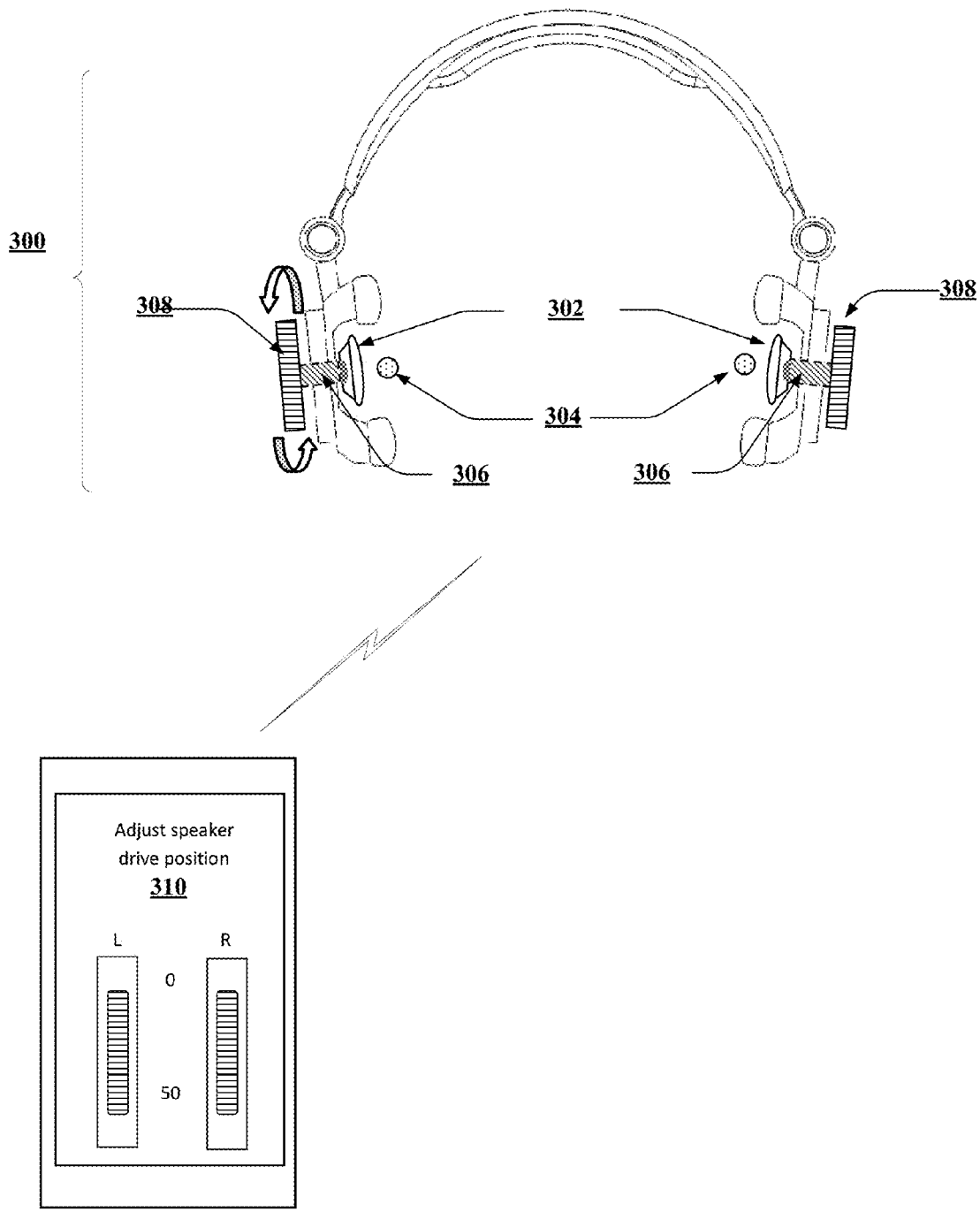
FIG. 3 illustrates an example headphone system communicating with a mobile device.

Referring now to FIG. 3, illustrated is an example headphone system 300 communicating with a mobile device 310. The headphone system 300 can have a rotatable knob(s) 308 that mechanically adjusts the position of the speaker driver(s) 302. The headphone system 300 can also have an acoustic sensor microphone(s) 304 that can be used to measure the loudness of a sound inside of the headphone system 300. The distance between the headphone system's 300 speaker driver(s) 302 and an ear canal can be adjusted mechanically by turning the rotatable knob(s) 308 clockwise or counter-clockwise so that a shaft(s) 306 moves away or toward the ear canal. A mobile device can also adjust the distance between the headphone system's 300 speaker driver(s) 302 and the ear canal wirelessly.

The headphone system 300 can communicate with the mobile device 310 via any wireless means including, but not limited to, Bluetooth, ZigBee, Wi-Fi, etc. The mobile device can wirelessly control and adjust the speaker driver(s) 302 position via a motor that can control the rotatable knob(s) 308 and/or the shaft(s) 306. The mobile device 310 of FIG. 3 displays an illustration of an example user interface that can adjust the left and/or the right speaker driver 302. Adjusting the speaker driver 302 location can adjust the audio quality of the headphone system 300.

Figure 4:
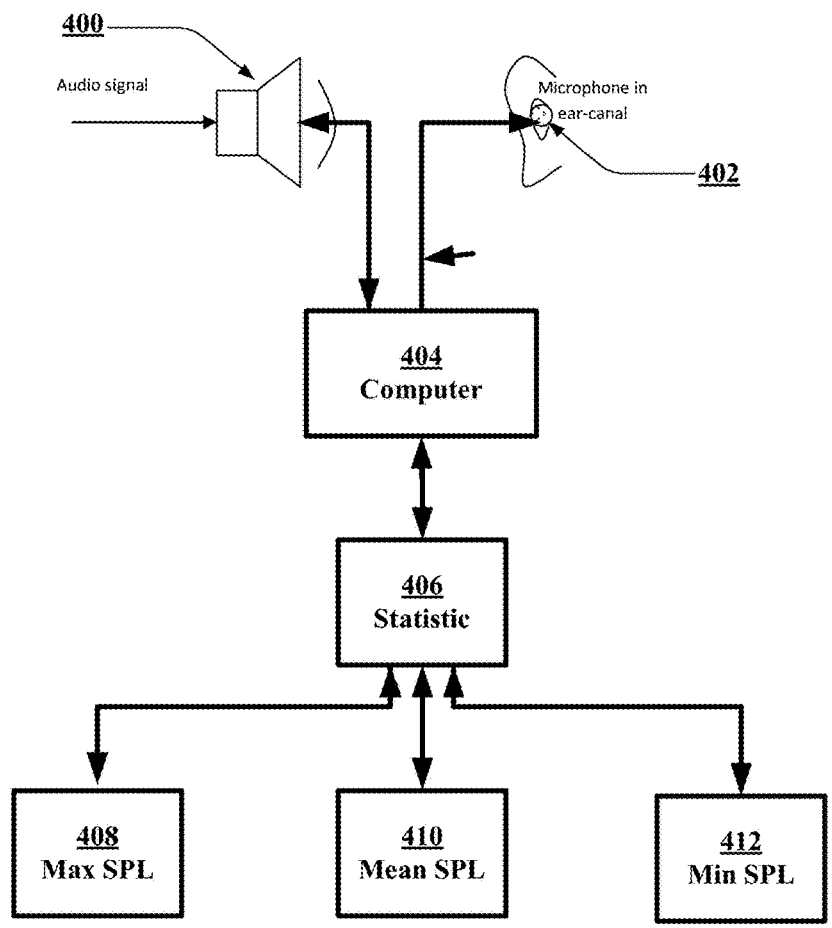
FIG. 4 illustrates an example headphone system processing audio signal data comprising a sound pressure level.

Referring now to FIG. 4, illustrated is an example headphone system processing audio signal data comprising a sound pressure level. The sound pressure level (SPL) can be measured at the actual microphone 402 location and a transfer function can be derived by a computer 404 within the headphone system. The computer 404 can also calibrate the SPL once the transfer function is derived. The SPL emitted from a speaker driver 400 can be estimated continuously as audio is playing. The continuous SPL estimation can allow for each song played to generate an SPL statistic 406 comprising a maximum SPL 408, a mean SPL 410, and a minimum SPL 412. The SPL statistic 406 can also comprise a probability SPL or a percentage of time that the SPL exceeds an acceptable critical hearing level (90 dB). The SPL statistic 406 data can be recorded and displayed via a graphical rendering on a mobile device.

If the detected SPL has exceeded the critical hearing level and/or has also exceeded a specific duration, an audible or visual warning signal can be presented by the headphone or mobile device wirelessly connected to the headphone. Based on the measured SPL of a specific song or audio file, an option can be presented to compress the song or audio file to an optimum level when the same song or audio file is played again. Captured data such as maximum SPL 408, mean SPL 410, and minimum SPL 412 of each song can also be transferred to a mobile device using a wireless means including, but not limited to: Bluetooth, Wireless Fidelity (Wi-Fi), ZigBee, etc. The captured audio data can be used to optimize the next playback of the same song so that a low level sound is enhanced and a high level sound is compressed.

Figure 5:
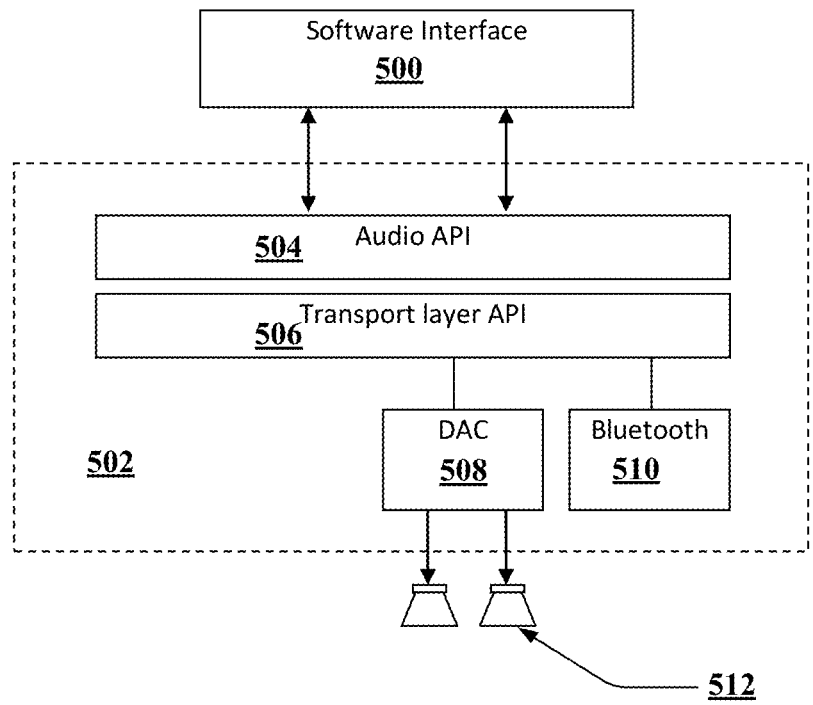
FIG. 5 illustrates an example software interface.

Referring now to FIG. 5, illustrated is an example software interface 500 running on top of a software development kit (SDK) 502 of a mobile device. The software interface 500 can connect to a headphone 512 via wired or wireless means, such as Bluetooth 510, through the audio layer 504 and transport layer 506 application interface (API). The digital to analog converter 508 can convert the sound prior to sending it to the headphone 512. The software interface 500 can work on a mobile device without knowing the exact internal construction of the mobile.

Figure 6:
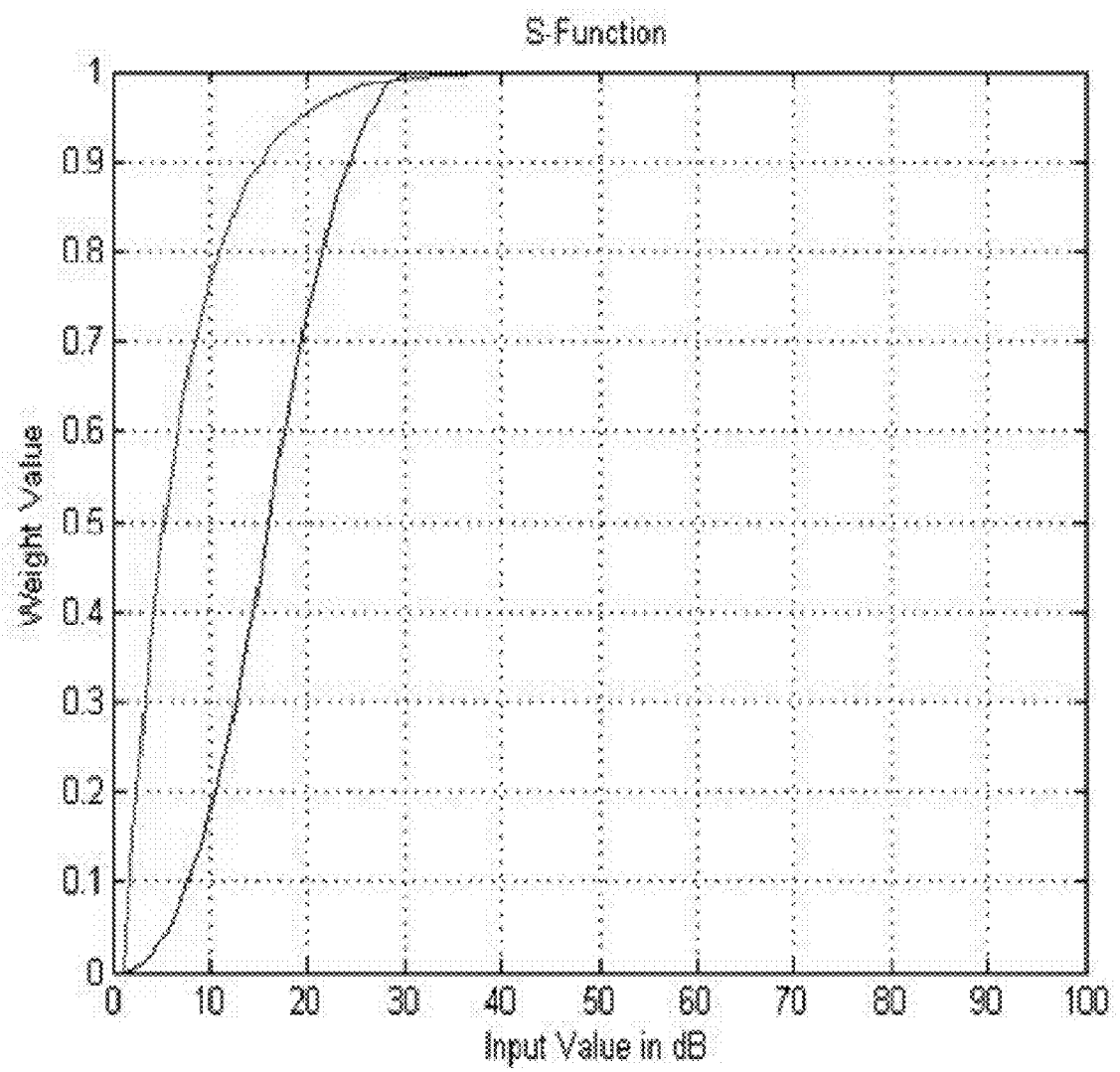
FIG. 6 illustrates an example weighing function graph of a sound pressure level.

Referring now to FIG. 6, illustrated is an example weighing function graph of a sound pressure level comprising a typical plot of the S-function of Equation (5) above. The lowest $\gamma$ and the upper limits $\beta$ can be adjusted empirically to achieve a required result. For small signals, especially those having energy below a specific noise level, the S-function can assign a small weight compared to the sound of a heavy signal with a very high energy level. The S-function can then be used to determine the overall loudness L of Equation (6), thus allowing a song or music maximum, minimum, average SPL and/or dynamic profile to be estimated.

Figure 7A:
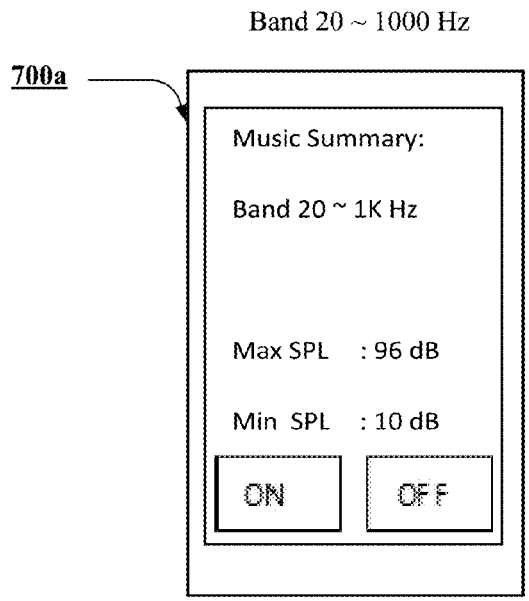
FIG. 7a illustrates an example graphical display with frequency band between 20 and 1000 Hz.
Figure 7B:
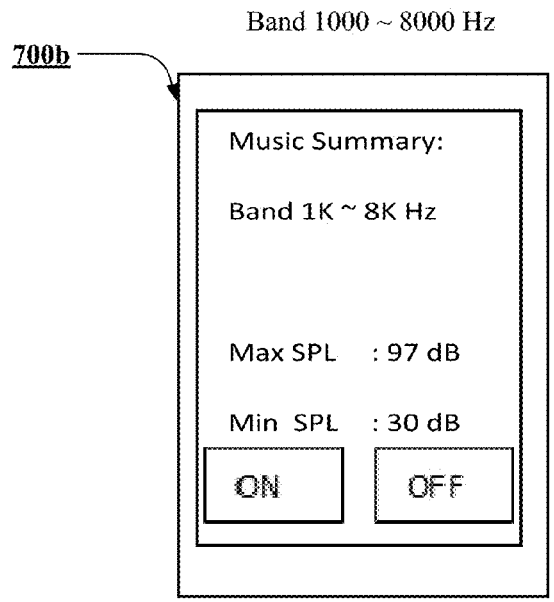
FIG. 7b illustrates an example graphical display with frequency band between 1000 and 8000 Hz.
Figure 7C:
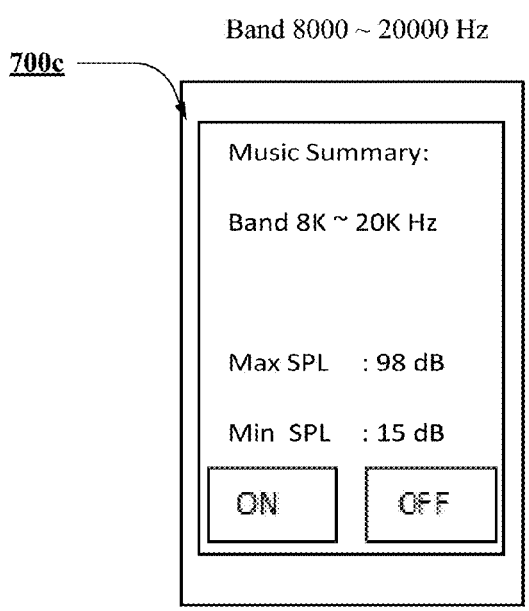
FIG. 7c illustrates an example graphical display with frequency band between 8000 and 20000 Hz.
Figure 7D:
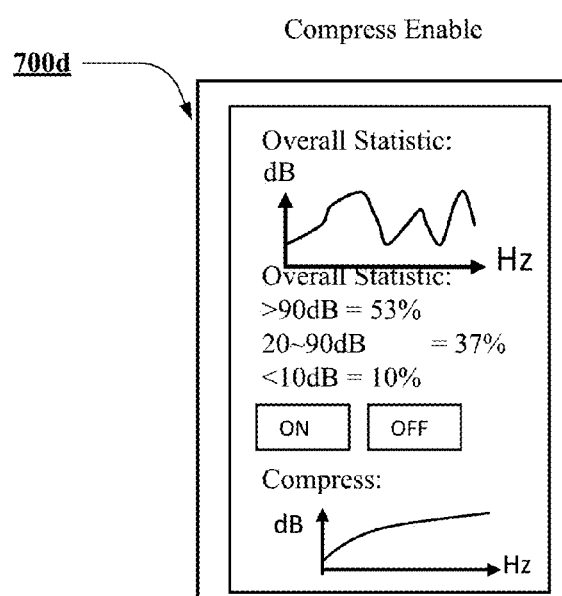
FIG. 7d illustrates an example graphical display of an overall dynamic range profile.

Referring now to FIGS. 7a-7c, illustrated is an example graphical display with a frequency band between 20 and 1000 Hz 700a, a frequency band between 1000 Hz and 8000 Hz 700b, and a frequency between 8000 Hz and 20000 Hz 700c, respectively. For each band and for each song, the SPL data can be captured during initial play and any future play of the song. For example, for a frequency band between 20 and 1000 Hz 700a, if the sound exceeded a maximum hearing level of 90 dB 18% of the time, the compress enable 700d graphical interface can display the overall SPL data of the sound. If the SPL consistently exceeds 90 dB for a prolonged period of time, the sound can be compressed below the 90 dB. SPL compression can be selected to allow an algorithm to optimize the overall sound level by using the captured SPL data from a previous play. A particular frequency band can also be selected to optimize the signal level of that specific frequency band selected instead of all frequency bands simultaneously.

Figure 8:
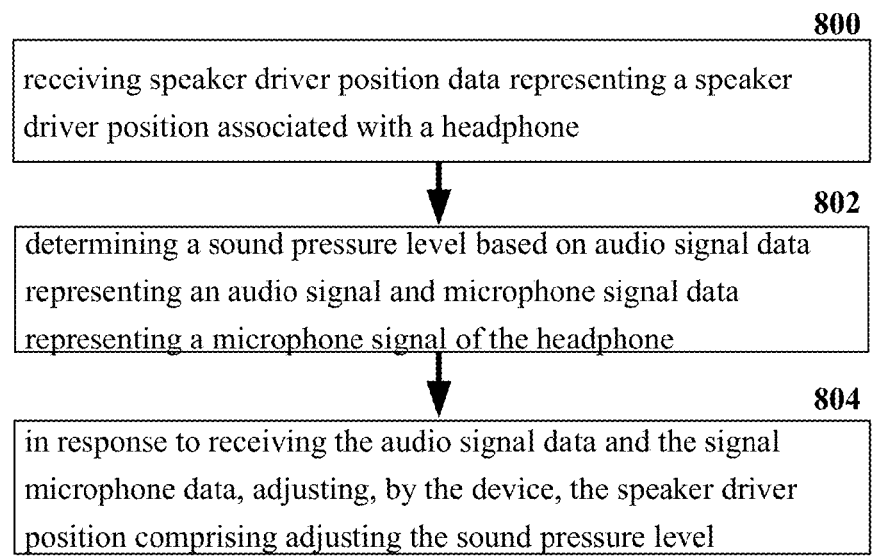
FIG. 8 illustrates an example flow diagram of a method for adjusting a speaker driver position.

Referring now to FIG. 8, illustrated is an example flow diagram of a method for adjusting a speaker driver position. At element 800 the speaker driver position data representing a speaker driver position associated with a headphone can be received. The speaker drivers can be positioned within an ear cup housing of the headphone system and maintain various positions relative to the ear cup. The speaker driver position data can be stored in the central processing unit of the headphone set. A sound pressure level based on audio signal data representing an audio signal and microphone signal data representing a microphone signal of the headphone can be determined at element 802. A microphone can be used to capture the audio signal emitting from the speaker driver inside of the headphone system and transmit microphone signal data to the central processing unit of the headphone system. The central processing unit of the headphone system can then determine a sound pressure level of the audio signal. At element 804, in response to receiving the audio signal data and the microphone signal data, adjusting the speaker driver position comprising adjusting the sound pressure level.

Figure 9:
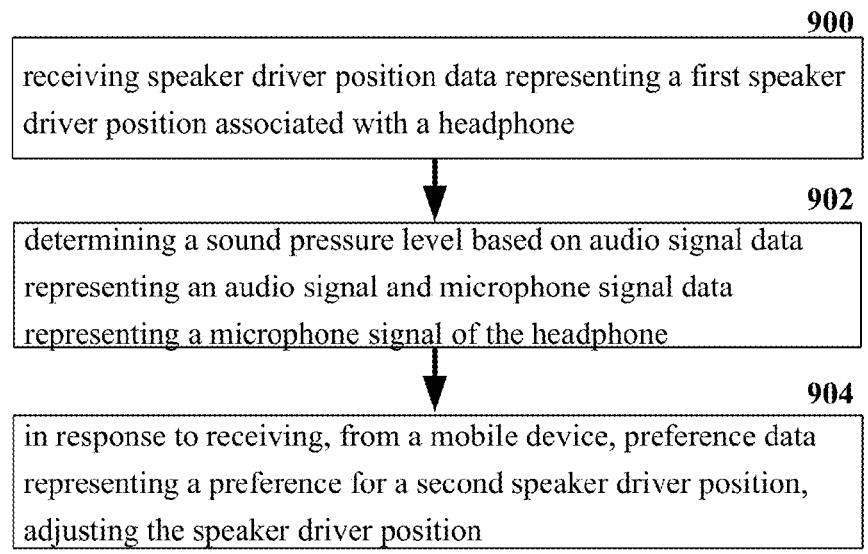
FIG. 9 illustrates an example flow diagram of a system for adjusting a speaker driver position.

Referring now to FIG. 9, illustrated is an example flow diagram of a system for adjusting a speaker driver position. At element 900 the speaker driver position data representing a first speaker driver position associated with a headphone can be received. The speaker driver can be positioned within an ear cup housing of the headphone system and maintain various positions relative to the ear cup. The speaker driver position data can be stored in the central processing unit of the headphone set. At element 902, a sound pressure level based on audio signal data representing an audio signal and microphone signal data representing a microphone signal of the headphone can be determined. The microphone can be used to capture the audio signal emitting from the speaker driver inside of the headphone system and transmit the microphone signal data to the central processing unit of the headphone system. The central processing unit of the headphone system can then determine a sound pressure level of the audio signal. At element 904, in response to receiving preference data representing a preference for a second speaker driver position, adjusting the second speaker driver position.

Figure 10:
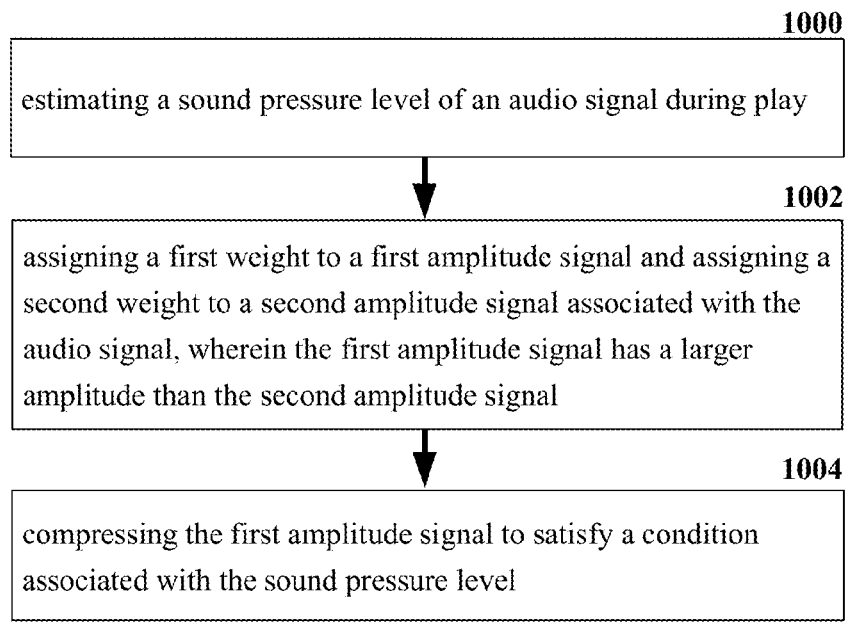
FIG. 10 illustrates an example flow diagram for compressing an amplitude signal.

Referring now to FIG. 10, illustrated is an example flow diagram for compressing an amplitude signal. At element 1000, a sound pressure level of an audio signal during play is estimated. A microphone can be used to capture the audio signal emitting from a speaker driver inside of a headphone system and transmit the microphone signal data to a central processing unit of the headphone system. The central processing unit of the headphone system can then estimate a sound pressure level of the audio signal. At element 1002 there can be a first weight assigned to a first amplitude signal and a second weight assigned to a second amplitude signal associated with an audio signal, wherein the first amplitude signal has a larger amplitude than the second amplitude signal. Due to varying signal levels associated with various audio types, high-level signals can be weighed more heavily than low-level signals for SPL estimation. To reduce the signal amplitude at a low frequency region (bass), the SPL can be estimated by pre-filtering the signal using a high pass IIR filter to approximate the inverse of a B-weighted function. Because most music has a high signal amplitude at a low frequency up to a middle frequency, the final SPL can compensate to reflect the actual SPL measured. At element 1004, first amplitude signal can be compressed the to satisfy a condition associated with the sound pressure level. For example, if the SPL consistently exceeds 90 dB for a prolonged period of time, the sound can be compressed below the 90 dB. SPL compression can be selected to allow an algorithm to optimize the overall sound level by using the captured SPL data from a previous play.

Figure 11:
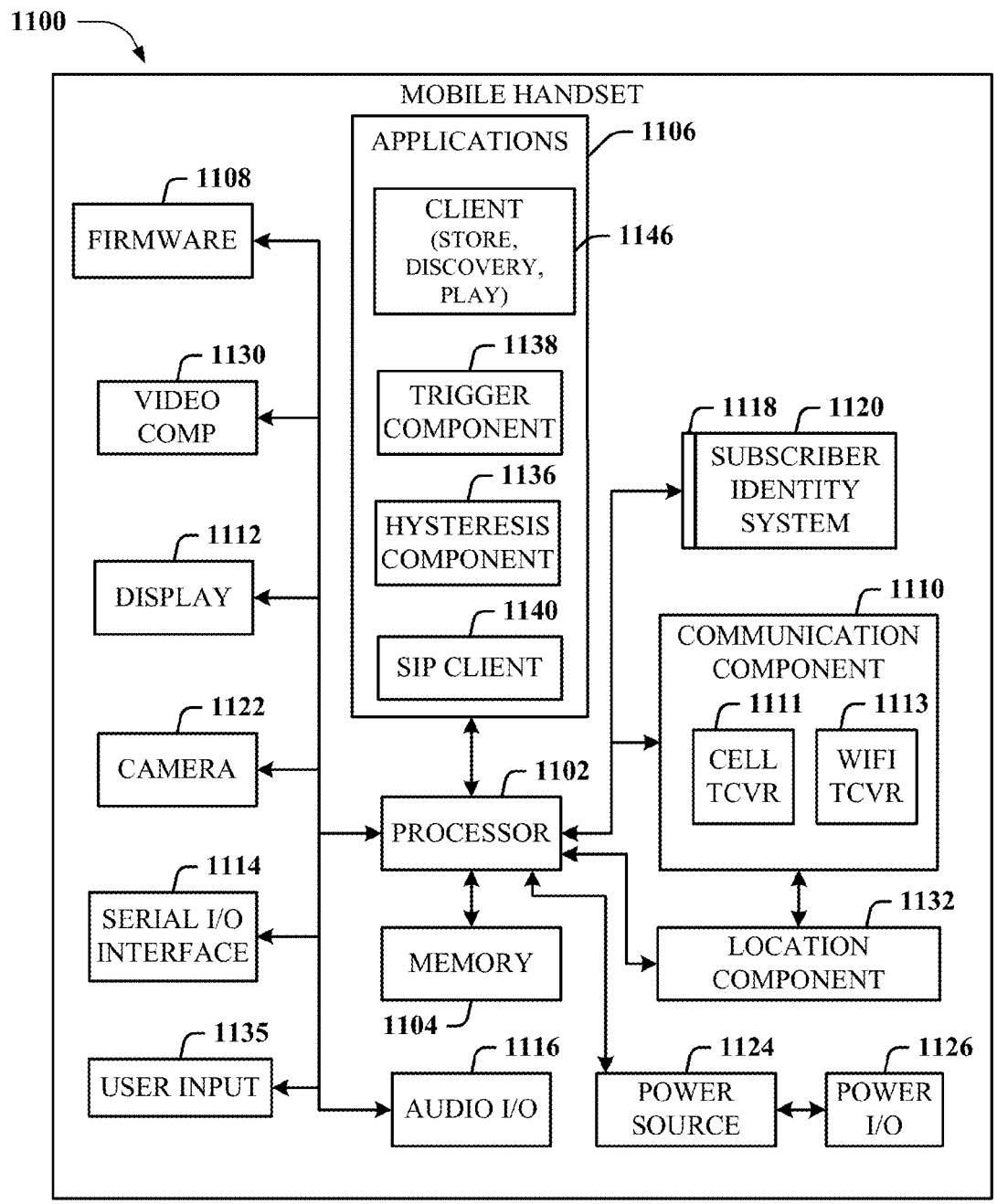
FIG. 11 illustrates a block diagram of an example mobile handset operable to engage in a system architecture that facilitates secure wireless communication according to the embodiments described herein.

Referring now to FIG. 11, illustrated is a schematic block diagram of an exemplary end-user device such as a mobile device 1100 capable of connecting to a network in accordance with some embodiments described herein. Although a mobile handset 1100 is illustrated herein, it will be understood that other devices can be a mobile device, and that the mobile handset 1100 is merely illustrated to provide context for the embodiments of the innovation described herein. The following discussion is intended to provide a brief, general description of an example of a suitable environment 1100 in which the various embodiments can be implemented. While the description includes a general context of computer-executable instructions embodied on a computer readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset 1100 includes a processor 1102 for controlling and processing all onboard operations and functions. A memory 1104 interfaces to the processor 1102 for storage of data and one or more applications 1106 (e.g., a video player software, user feedback component software, etc.). Other applications can include voice recognition of predetermined voice commands that facilitate initiation of the user feedback signals. The applications 1106 can be stored in the memory 1104 and/or in a firmware 1108, and executed by the processor 1102 from either or both the memory 1104 or/and the firmware 1108. The firmware 1108 can also store startup code for execution in initializing the handset 1100. A communications component 1110 interfaces to the processor 1102 to facilitate wired/wireless communication with external systems, e.g., cellular networks, VoIP networks, and so on. Here, the communications component 1110 can also include a suitable cellular transceiver 1111 (e.g., a GSM transceiver) and/or an unlicensed transceiver 1113 (e.g., WiFi, WiMax) for corresponding signal communications. The handset 1100 can be a device such as a cellular telephone, a PDA with mobile communications capabilities, and messaging-centric devices. The communications component 1110 also facilitates communications reception from terrestrial radio networks (e.g., broadcast), digital satellite radio networks, and Internet-based radio services networks.

The handset 1100 includes a display 1112 for displaying text, images, video, telephony functions (e.g., a Caller ID function), setup functions, and for user input. For example, the display 1112 can also be referred to as a "screen" that can accommodate the presentation of multimedia content (e.g., music metadata, messages, wallpaper, graphics, etc.). The display 1112 can also display videos and can facilitate the generation, editing and sharing of video quotes. A serial I/O interface 1114 is provided in communication with the processor 1102 to facilitate wired and/or wireless serial communications (e.g., USB, and/or IEEE 1394) through a hardwire connection, and other serial input devices (e.g., a keyboard, keypad, and mouse). This supports updating and troubleshooting the handset 1100, for example. Audio capabilities are provided with an audio I/O component 1116, which can include a speaker for the output of audio signals related to, for example, indication that the user pressed the proper key or key combination to initiate the user feedback signal. The audio I/O component 1116 also facilitates the input of audio signals through a microphone to record data and/or telephony voice data, and for inputting voice signals for telephone conversations.

The handset 1100 can include a slot interface 1118 for accommodating a SIC (Subscriber Identity Component) in the form factor of a card Subscriber Identity Module (SIM) or universal SIM 1120, and interfacing the SIM card 1120 with the processor 1102. However, it is to be appreciated that the SIM card 1120 can be manufactured into the handset 1100, and updated by downloading data and software.

The handset 1100 can process IP data traffic through the communication component 1110 to accommodate IP traffic from an IP network such as, for example, the Internet, a corporate intranet, a home network, a person area network, etc., through an ISP or broadband cable provider. Thus, VoIP traffic can be utilized by the handset 800 and IP-based multimedia content can be received in either an encoded or decoded format.

A video processing component 1122 (e.g., a camera) can be provided for decoding encoded multimedia content. The video processing component 1122 can aid in facilitating the generation, editing and sharing of video quotes. The handset 1100 also includes a power source 1124 in the form of batteries and/or an AC power subsystem, which power source 1124 can interface to an external power system or charging equipment (not shown) by a power I/O component 1126.

The handset 1100 can also include a video component 1130 for processing video content received and, for recording and transmitting video content. For example, the video component 1130 can facilitate the generation, editing and sharing of video quotes. A location tracking component 1132 facilitates geographically locating the handset 1100. As described hereinabove, this can occur when the user initiates the feedback signal automatically or manually. A user input component 1134 facilitates the user initiating the quality feedback signal. The user input component 1134 can also facilitate the generation, editing and sharing of video quotes. The user input component 1134 can include such conventional input device technologies such as a keypad, keyboard, mouse, stylus pen, and/or touch screen, for example.

Referring again to the applications 1106, a hysteresis component 1136 facilitates the analysis and processing of hysteresis data, which is utilized to determine when to associate with the access point. A software trigger component 1138 can be provided that facilitates triggering of the hysteresis component 1138 when the Wi-Fi transceiver 1113 detects the beacon of the access point. A SIP client 1140 enables the handset 1100 to support SIP protocols and register the subscriber with the SIP registrar server. The applications 1106 can also include a client 1142 that provides at least the capability of discovery, play and store of multimedia content, for example, music.

The handset 1100, as indicated above related to the communications component 810, includes an indoor network radio transceiver 1113 (e.g., Wi-Fi transceiver). This function supports the indoor radio link, such as IEEE 802.11, for the dual-mode GSM handset 1100. The handset 1100 can accommodate at least satellite radio services through a handset that can combine wireless voice and digital radio chipsets into a single handheld device.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A non-transitory computer readable storage device having executable instructions stored thereon that, in response to execution, cause a system comprising a processor to perform operations, comprising:
   estimating a sound pressure level of an audio signal during play, wherein the estimating the sound pressure level is based on a continuous estimation of the sound pressure level;

in response to the estimating the sound pressure level, generating sound pressure level data associated with a weighted sound pressure level signal;

assigning a first weight to a first amplitude signal and assigning a second weight to a second amplitude signal associated with the audio signal, wherein the first amplitude signal has a larger amplitude than the second amplitude signal; and based on the weighted sound pressure level data, compressing the first amplitude signal to satisfy a condition associated with the sound pressure level.

2. The non-transitory computer readable storage device of claim 1, wherein the condition associated with the sound pressure level is based on a critical hearing level.

3. The non-transitory computer readable storage device of claim 1, further comprising:

compressing the second amplitude signal to satisfy the condition associated with the sound pressure level.

4. The non-transitory computer readable storage device of claim 3, wherein the condition associated with the sound pressure level is based on a noise level.

5. The non-transitory computer readable storage device of claim 1, further comprising:

determining a noise level by averaging the first weight of the first amplitude signal with the second weight of the second amplitude signal.

6. The non-transitory computer readable storage device of claim 5, wherein the determining comprises normalizing the first weight of the first amplitude signal and normalizing the second weight of the second amplitude signal.

7. The non-transitory computer readable storage device of claim 1, further comprising:

displaying sound pressure level data, on a mobile device, representative of the sound pressure level of a headphone.

8. A method, comprising:

estimating, by a device comprising a processor, a sound pressure level associated with an audio signal, wherein the estimating comprises a repeated estimation of the sound pressure level;

in response to the estimating the sound pressure level, generating, by the device, sound pressure level data associated with a weighted sound pressure level signal;

assigning, by the device, a first weight to a first amplitude signal and assigning a second weight to a second amplitude signal associated with the audio signal, wherein the first amplitude signal has a larger amplitude than the second amplitude signal; and based on the weighted sound pressure level data, compressing, by the device, the first amplitude signal to satisfy a condition associated with the sound pressure level.

9. The method of claim 8, further comprising:

based on a manual input received by the device, adjusting, by the device, a speaker driver position of a speaker driver of the device.

10. The method of claim 9, wherein the adjusting of the speaker driver position comprises sending an instruction to adjust the speaker driver position wirelessly.

11. The method of claim 9, further comprising:

based on audio signal data associated with the audio signal and microphone signal data associated with a microphone of the device, calibrating, by the device, the sound pressure level between the microphone and the speaker driver.

12. The method of claim 8, further comprising:

in response to the condition associated with the sound pressure level being determined to have been satisfied, sending, by the device to a mobile device, warning data representative of a warning signal.

13. The method of claim 12, wherein the condition is associated with a critical hearing level.

14. The method of claim 8, further comprising:

storing, by the device, sound pressure level data representing the sound pressure level in a memory accessible to the device.

15. A system, comprising:

a processor; and a memory that stores executable instructions that, when executed by the processor, facilitate performance of operations, comprising:

determining a sound pressure level associated with an audio signal of a headphone wherein the determining comprises uninterruptedly estimating the sound pressure level;

in response to the continuously estimating the sound pressure level, generating sound pressure level data associated with a weighted sound pressure level signal;

assigning a first value to a first amplitude signal and assigning a second value to a second amplitude signal associated with the audio signal, wherein the first amplitude signal is greater than the second amplitude signal; and in response to the assigning and based on the weighted sound pressure level data, compressing the first amplitude signal to satisfy a condition associated with the sound pressure level.

16. The system of claim 15, wherein the operations further comprise:

receiving a manual input from a mobile device via a wireless connection.

17. The system of claim 16, wherein the mobile device comprises an interface configured to receive an input of preference data.

18. The system of claim 17, wherein the interface is further configured to display a graphical representation of overall band frequency sound pressure location data representing an overall band frequency applicable to operation of the headphone.

19. The system of claim 17, wherein the interface is further configured to display a graphical representation enabling an adjustment of a speaker driver position of a speaker driver of the headphone.

20. The system of claim 19, wherein the operations further comprise:

in response to receiving adjustment data, from the mobile device, indicative of the adjustment to be made to the speaker driver position of the headphone, adjusting the speaker driver position.

* * * * *